United States Patent
Kawai et al.

(10) Patent No.: US 9,416,434 B2
(45) Date of Patent: Aug. 16, 2016

(54) HIGH-TOUGHNESS COATING FILM AND SLIDING MEMBER

(75) Inventors: Kiyoyuki Kawai, Tokyo (JP); Shoji Tanaka, Tokyo (JP)

(73) Assignee: TPR CO., LTD., Tokyo (JP)

(*) Notice: Subject to any disclaimer, the term of this patent is extended or adjusted under 35 U.S.C. 154(b) by 0 days.

(21) Appl. No.: 14/385,183

(22) PCT Filed: Mar. 16, 2012

(86) PCT No.: PCT/JP2012/056851
§ 371 (c)(1),
(2), (4) Date: Sep. 15, 2014

(87) PCT Pub. No.: WO2013/136510
PCT Pub. Date: Sep. 19, 2013

(65) Prior Publication Data
US 2015/0093586 A1    Apr. 2, 2015

(51) Int. Cl.
| C23C 14/06 | (2006.01) |
| C22C 27/06 | (2006.01) |
| F16J 9/26 | (2006.01) |
| C23C 14/32 | (2006.01) |

(52) U.S. Cl.
CPC .............. *C22C 27/06* (2013.01); *C23C 14/0641* (2013.01); *C23C 14/32* (2013.01); *F16J 9/26* (2013.01); *Y10T 428/31678* (2015.04)

(58) Field of Classification Search
USPC ......................................... 428/469, 472, 698
See application file for complete search history.

(56) References Cited

U.S. PATENT DOCUMENTS

| 4,486,285 A | 12/1984 | Aubert et al. |
| 5,160,537 A * | 11/1992 | Terrat .................. C23C 14/0688 106/36 |
| 5,582,414 A | 12/1996 | Miyazaki et al. |

FOREIGN PATENT DOCUMENTS

| JP | 58144473 A | 8/1983 |
| JP | 61087950 A | 5/1986 |
| JP | 06010454 B | 1/1994 |
| JP | 6346224 A | 12/1994 |
| JP | H931628 A | 4/1997 |
| JP | 2009161813 A | 7/2009 |
| JP | 2011173244 A | 9/2011 |

OTHER PUBLICATIONS

International Search Report for International Application No. PCT/JP2012/056851; Date of Mailing, May 22, 2012; with English translation.

* cited by examiner

*Primary Examiner* — Archene Turner
(74) *Attorney, Agent, or Firm* — Cantor Colburn LLP

(57) ABSTRACT

Provided is a high-toughness coating film having excellent wear resistance, in particular, resistance to cracking and peeling. A high-toughness coating film (2) includes a composition containing a mixture of metallic chromium, in which nitrogen is dissolved, and Cr2N. A content of the nitrogen in the high-toughness coating film is 2.0 to 8.5 mass %, and IP, which is expressed by total of each diffraction peak intensity of Cr2N/(total of each diffraction peak intensity of metallic chromium+total of each diffraction peak intensity of Cr2N), is 3 to 40% when 2θ is in a range of 30° to 90°, where θ is an incident angle in X-ray diffraction of the high-toughness coating film.

7 Claims, 6 Drawing Sheets

HIGH-TOUGHNESS COATING FILM AND SLIDING MEMBER

CROSS REFERENCE TO RELATED APPLICATIONS

This is the U.S. national stage of application No. PCT/JP2012/056851, filed on Mar. 16, 2012, the disclosure of which is incorporated herein by reference.

TECHNICAL FIELD

The present invention relates to a high-toughness coating film, and to a sliding member such as a piston ring coated with the high-toughness coating film.

BACKGROUND ART

Conventionally, a sliding member such as a piston ring in an internal-combustion engine is required to have high sliding performance on a sliding surface thereof, and a Cr plating or a chromium nitride coating film has been used therefor. However, in recent years, the burden on the surface of the sliding member has been increasing due to an increase in output, countermeasures against exhaust gas, and further to the light-weighting of the internal-combustion engine. To address the increase in burden on the sliding member, however, the hard CR plating has insufficient wear resistance, and the chromium nitride coating film has low toughness in spite of its high hardness and excellent wear resistance. Thus, in the case where the sliding environment in the engine is aggravated, there is a problem in that the chromium nitride coating film may be cracked or peeled during use. Accordingly, there is a demand for the development of a chromium nitride coating film which is less likely to be cracked and peeled even under severer conditions.

Patent Literature 1 proposes a coating film having a composition in which one element selected from the group consisting of carbon, phosphorus, nitrogen, boron, and silicon is dissolved in metallic chromium so that the coating film has high hardness, hydrogen brittleness, toughness, and fatigue resistance. Patent Literature 2 proposes a piston ring exhibiting wear resistance and a seizure-resistant characteristic, in which a sliding surface thereof is coated with a coating film having a composition of a mixture containing metallic chromium and chromium nitride ($Cr_2N$).

CITATION LIST

Patent Literature

Patent Literature 1: JP 58-144473 A
Patent Literature 2: JP 06-010454 B

SUMMARY OF INVENTION

Technical Problem

However, the wear resistance of the chromium coating film of Patent Literature 1 may be insufficient in a severe sliding environment. Further, Patent Literature 2 does not disclose the detail of toughness of the coating film, and does not even describe the influence of the content of $Cr_2N$ with respect to Cr on the toughness of the coating film.

It is an object of the present invention to provide a high-toughness coating film having excellent wear resistance, in particular, resistance to cracking and peeling.

Solution to Problem

According to one embodiment of the present invention, there is provided a high-toughness coating film, including a composition containing a mixture of metallic chromium having dissolved nitrogen therein and $Cr_2N$, in which a content of the nitrogen in the high-toughness coating film is 2.0 to 8.5 mass %, and in which IP, which is expressed by total of each diffraction peak intensity of $Cr_2N$/(total of each diffraction peak intensity of metallic chromium+total of each diffraction peak intensity of $Cr_2N$), is 3 to 40% when 2θ is in a range of 30° to 90°, where θ is an incident angle in X-ray diffraction of the high-toughness coating film.

The above-mentioned IP is calculated by measuring diffraction peak intensity of a {110} plane, a {200} plane, and a {211} plane of metallic chromium, and diffraction peak intensity of a {110} plane, a {002} plane, a {111} plane, a {112} plane, a {300} plane, a {113} plane, a {302} plane, and a {221} plane of $Cr_2N$ when 2θ is in a range of 30° to 90°, where θ is an incident angle.

In the high-toughness coating film described above, according to the present invention, it is more preferred that the content of the nitrogen in the high-toughness coating film be 3.0 to 7.0 mass %, and that the IP be 10 to 30%.

It is preferred that a micro-Vickers hardness of the high-toughness coating film be 950 to 1,600 HV.

It is more preferred that a micro-Vickers hardness of the high-toughness coating film be 1,100 to 1,500 HV.

It is preferred that the high-toughness coating film have a metallic chromium coating film provided therebelow.

The high-toughness coating film is coated on, for example, a sliding member (such as a piston ring).

Advantageous Effects of Invention

According to the present invention, it is possible to obtain the high-toughness coating film having excellent wear resistance, in particular, excellent resistance to cracking and peeling.

DESCRIPTION OF EMBODIMENTS

Figure 1:
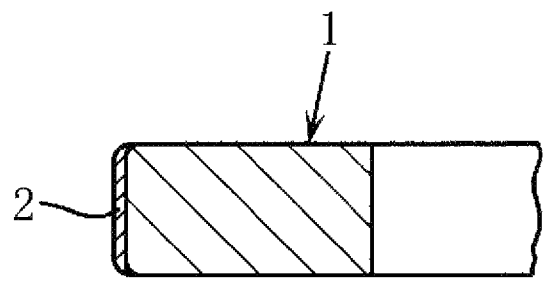
FIG. 1 is a vertical sectional view of a part of a piston ring according to an embodiment of the present invention.

Embodiments of the present invention are hereinafter described. FIG. 1 is a vertical sectional view of a part of a piston ring 1. The piston ring 1 has a rectangular cross-section, and is made of steel, cast iron, or the like. An outer circumferential surface of the piston ring 1 is coated with a high-toughness coating film 2.

The high-toughness coating film 2 has a composition of a mixture containing metallic chromium having dissolved nitrogen therein and $Cr_2N$. The nitrogen content of the high-toughness coating film 2 is 2.0 to 8.5 mass %, and IP, which is expressed by total of each diffraction peak intensity of $Cr_2N$/(total of each diffraction peak intensity of metallic chromium+total of each diffraction peak intensity of $Cr_2N$), is 3 to 40% when 2θ is in a range of 30° to 90°, where θ is an incident angle in X-ray diffraction of the coating film.

When the nitrogen content in the coating film 2 is less than 2.0 mass %, the hardness of the coating film 2 decreases, and the coating film 2 is likely to peel along with an increase in wear amount. When the nitrogen content is more than 8.5 mass %, the toughness of the coating film 2 decreases, and cracking and peeling are likely to occur. IP>0 indicates that $Cr_2N$ is present in the coating film 2. When the IP is less than 3% while the content of nitrogen is equal to or more than 2.0 mass %, the amount of $Cr_2N$ becomes smaller and the hardness of the coating film 2 decreases, with the result that the peeling of the coating film 2 involved in the decrease in hardness is likely to occur along with an increase in wear amount. When the IP is more than 40%, the amount of $Cr_2N$ becomes larger and the toughness of the coating film 2 decreases, with the result that cracking and peeling are likely to occur.

It is more preferred that the content of nitrogen of the coating film 2 be 3.0 to 7.0 mass %, and the IP thereof be 10 to 30% from the viewpoint of ensuring high toughness.

It is preferred that the micro-Vickers hardness of the coating film 2 be 950 to 1,600 HV. When the micro-Vickers hardness is less than 950 HV, the wear resistance becomes insufficient, and the wear amount increases. When the micro-Vickers hardness is more than 1,600 HV, the toughness of the coating film 2 decreases, with the result that cracking and peeling are likely to occur. It is more preferred that the micro-Vickers hardness be 1,100 to 1,500 HV from the viewpoint of ensuring high toughness.

The high-toughness coating film 2 can be produced by PVD such as ion plating and sputtering. The case where the high-toughness coating film 2 is produced by ion plating is hereinafter described.

A degreased and washed piston ring is set on a rotation table in a film-formation chamber, and the chamber is evacuated. When the vacuum degree reaches about $1.3 \times 10^{-3}$ Pa, the piston ring is heated to about 573 K to 773 K with a heater in the chamber, and simultaneously, the rotation table is driven. Although the vacuum degree is temporarily degraded due to the release of the water vapor and gas component adsorbed to the surface of the piston ring, the vacuum degree increases again to about $5 \times 10^{-3}$ Pa. After that, a small amount of argon or nitrogen gas is introduced into the chamber to gasify chromium serving as a target material. At this time, a bias voltage of about −500 V to −1,000 V is applied to the piston ring, and ions generated by arc discharge are allowed to impinge against the surface of the piston ring. Thus, so-called bombard cleaning is performed. Through the bombard cleaning, the cleanliness of the surface of the piston ring is enhanced, and the adhesiveness of the coating film can be enhanced.

After that, the bias voltage is decreased to about 0 to 100 V, and mixed gas of argon and nitrogen is introduced into the chamber so that the pressure therein reaches about 0.7 to 4 Pa. In this manner, a coating film is deposited.

The content of nitrogen in the coating film can be controlled based on the internal pressure of gas to be introduced into the chamber and the partial pressure of nitrogen.

The IP of the coating film can be controlled based on treatment conditions such as the arrangement relationship between the target and the material to be treated, a bias voltage, an arc current, and treatment temperature. Although the IP of the coating film tends to increase along with an increase in nitrogen content, the IP varies depending on the treatment conditions even when the nitrogen content is the same as shown in Table 2.

In the present invention, the thickness of the coating film is not particularly defined, but is preferably about 5 to 50 μm. The film thickness of the coating film can be controlled based on a value of an arc current during film formation and the film formation time.

Figure 2:
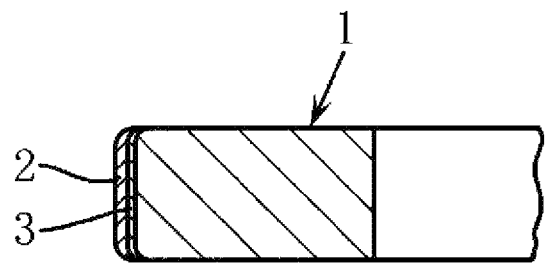
FIG. 2 is a vertical sectional view of a part of a piston ring according to another embodiment of the present invention.

A base may be coated with a metallic chromium coating film before being coated with a high-toughness coating film so as to enhance the adhesiveness of the high-toughness coating film. FIG. 2 illustrates the piston ring 1 coated with a metallic chromium coating film 3 below the high-toughness coating film 2 of the present invention.

A sample was produced by the above-mentioned method, and wear resistance and resistance to cracking and peeling of the high-toughness coating film of the present invention were evaluated.

Figure 3:
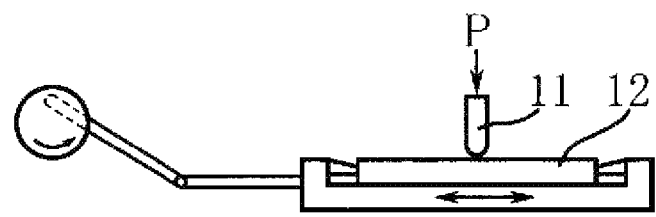
FIG. 3 is a view illustrating a configuration of a reciprocal dynamic friction testing machine.

The wear resistance was evaluated by measuring the wear amount of a ring material after a ring-on-plate type reciprocal dynamic friction testing machine illustrated in FIG. 3 was operated under a predetermined load for a predetermined period of time.

The reciprocal dynamic friction testing machine is configured as follows. An upper test piece 11 corresponding to a piston ring is pressed against a lower test piece 12 corresponding to a cylinder bore by applying a load P with a spring, and the upper test piece 11 and the lower test piece 12 slide when the lower test piece 12 moves reciprocally. Lubricating oil is supplied through use of a tubing pump or an air dispenser. After the reciprocal dynamic friction testing machine was operated at a predetermined speed under a predetermined load for a predetermined period of time, the wear length of the upper test piece 11 was measured with a surface roughness meter. The wear length is a wear length in an axial direction determined based on a shape difference of the upper test piece 11 before and after the operation. The test condition is a load of 100 N, a speed of 600 cpm, and a time of 60 minutes.

Figure 4:
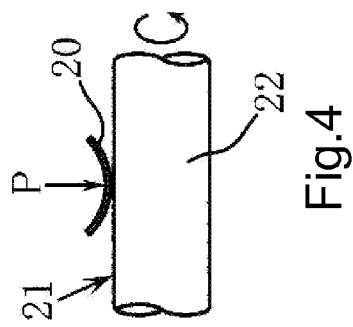
FIG. 4 is a view illustrating a configuration of a friction testing machine.

The resistance to cracking and peeling was evaluated through use of a ring-on-rotor type friction testing machine illustrated in FIG. 4.

The friction testing machine evaluates the relative superiority of characteristics based on the presence/absence of damages (cracking or peeling) on a sliding surface after the operation for a predetermined period of time by pressing, with a weight, a piston ring piece 20 onto an outer circumferential surface 22 of a rotor 21 which rotates at a predetermined speed. In the case where there are no damages, the piston ring piece 20 is replaced by a new one. Then, a test load is increased, and a test is conducted again. A characteristic value is determined based on the load P under which cracking or peeling finally occurs on the coating film. Note that, lubricating oil is supplied to a contact portion between the piston ring piece 20 and the rotor 21 during the test. The test is conducted under the conditions of an initial load of 50N (increased by 5 N if there is no cracking or peeling), a speed of 1,000 rpm, and a time of one minute.

Figure 5:
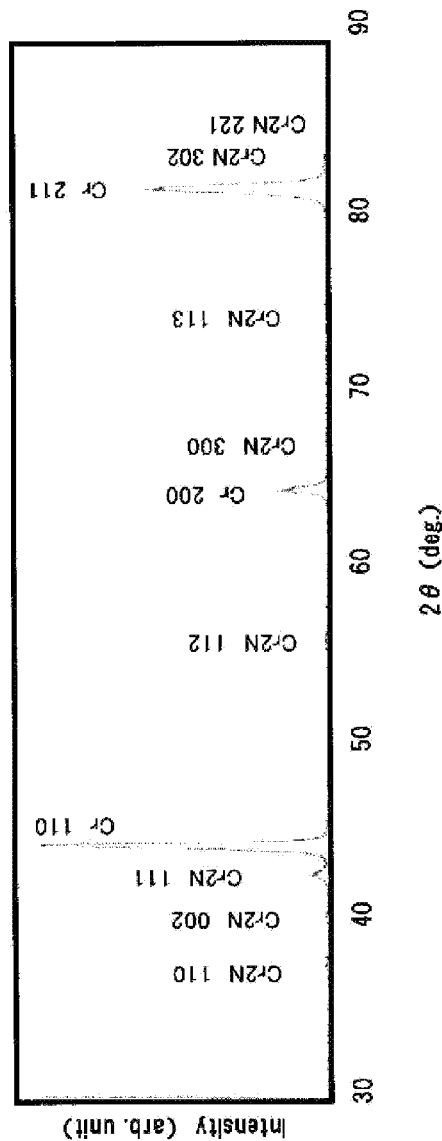
FIG. 5 is an X-ray diffraction diagram of a coating film of Sample No. 1 according to an example shown in Table 1.
Figure 6:
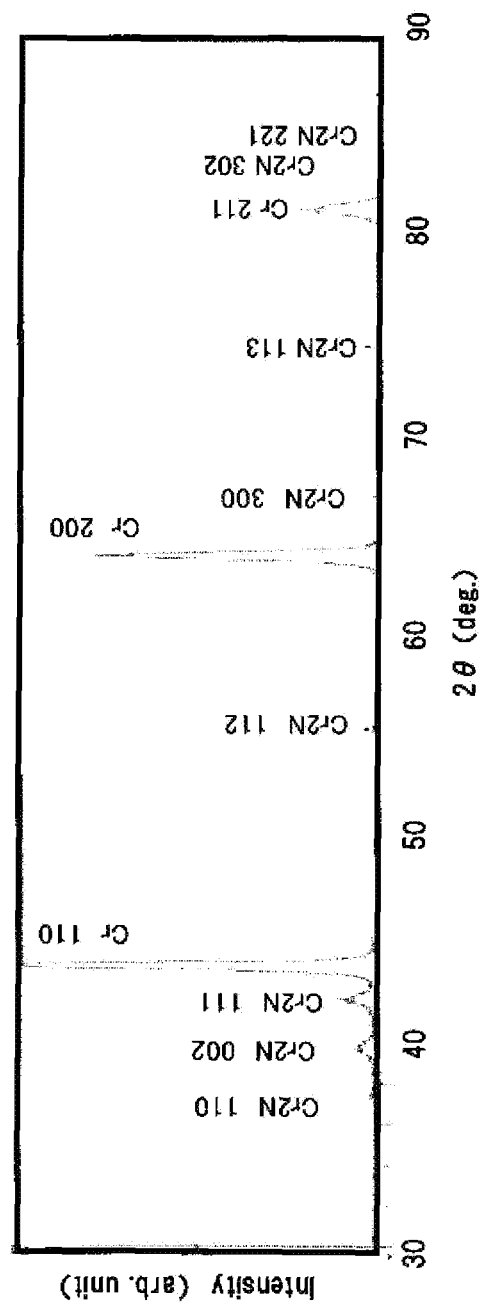
FIG. 6 is an X-ray diffraction diagram of a coating film of Sample No. 6 according to an example shown in Table 1.
Figure 7:
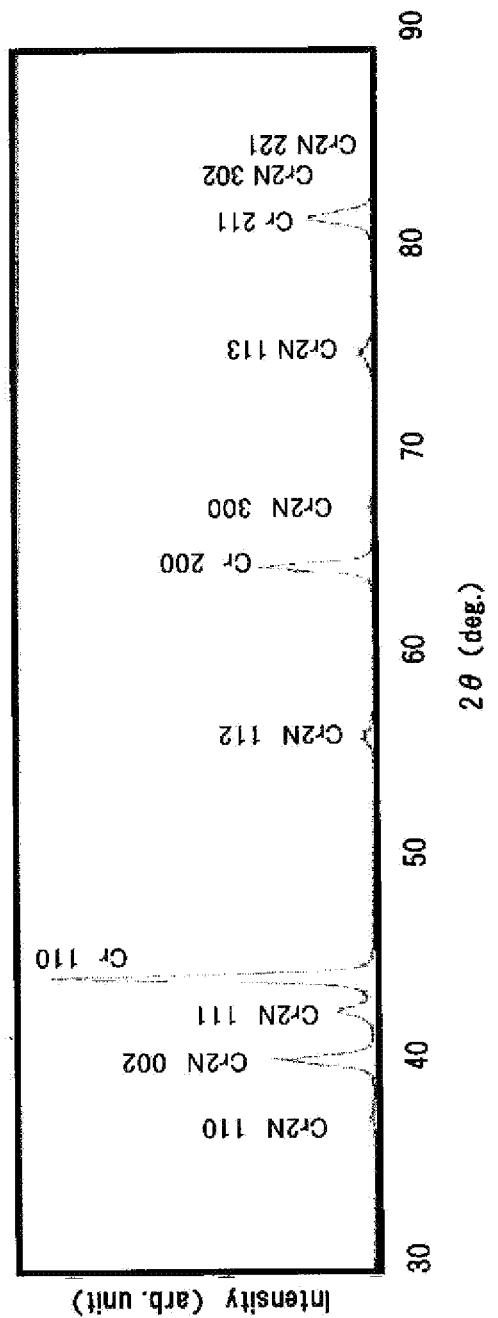
FIG. 7 is an X-ray diffraction diagram of a coating film of Sample No. 12 according to an example shown in Table 1.
Figure 8:
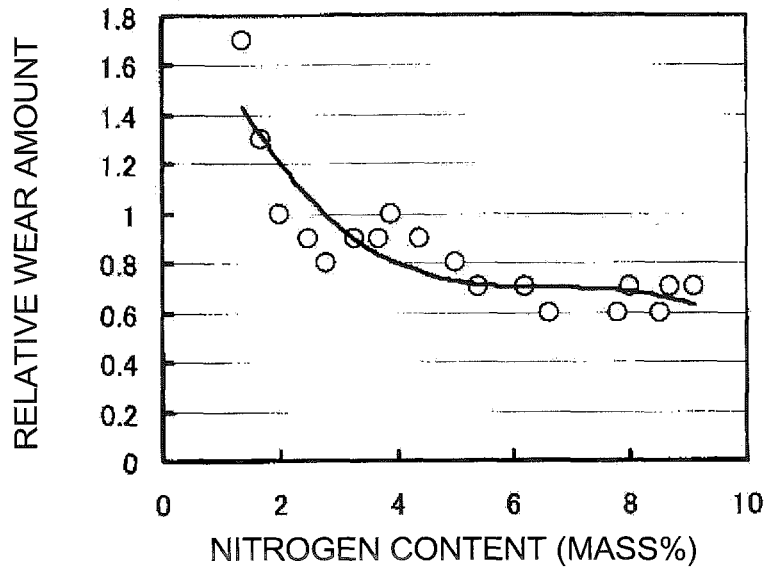
FIG. 8 is a graph showing a nitrogen content and a relative wear amount in Table 1.
Figure 9:
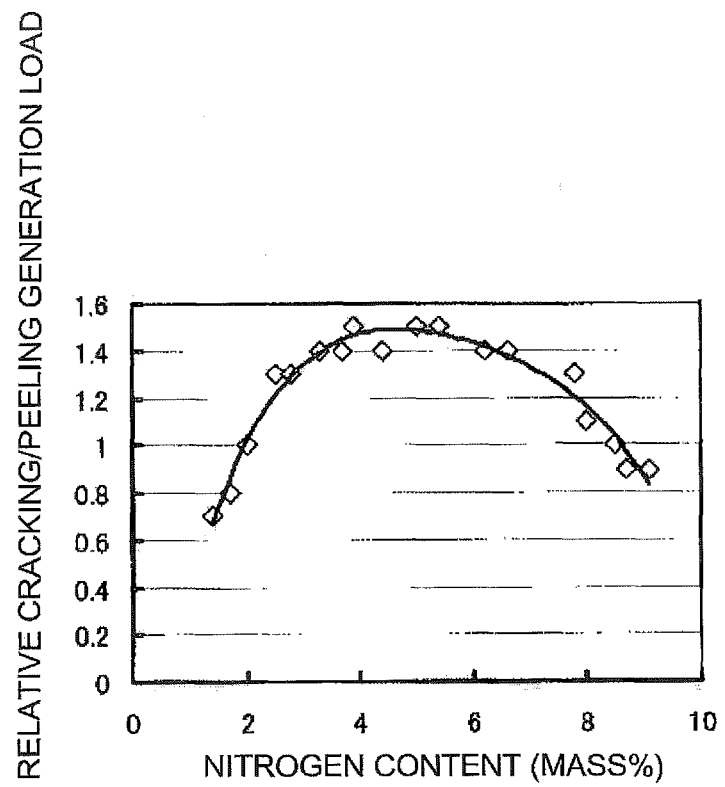
FIG. 9 is a graph showing a nitrogen content and a relative cracking/peeling generation load in Table 1.
Figure 10:
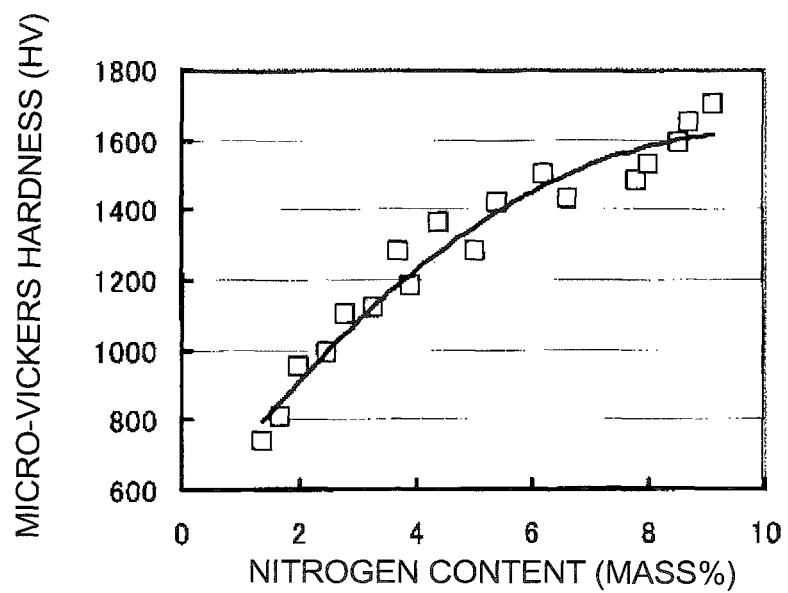
FIG. 10 is a graph showing a nitrogen content and micro-Vickers hardness in Table 1.
Figure 11:
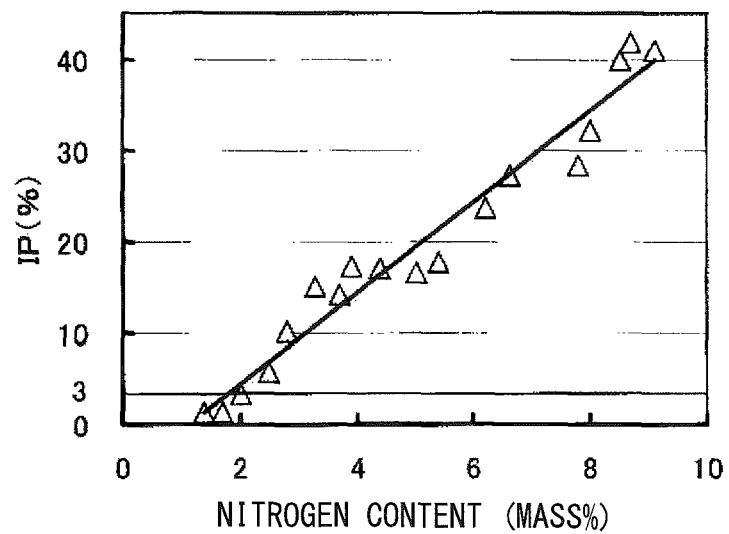
FIG. 11 is a graph showing a nitrogen content and an IP in Table 1.

FIGS. 5 to 7 are X-ray diffraction diagrams of the high-toughness coating film of the present invention. As a tube for X-ray diffraction, a Cu tube was used, and as an X-ray, a Kα-ray was used.

FIG. 5 is an X-ray diffraction diagram of Sample No. 1 according to an example shown in Table 1, and a diffraction peak of metallic chromium is present on a {110} plane, a {200} plane, and a {211} plane, and a diffraction peak of $Cr_2N$ is present on a {110} plane, a {002} plane, a {111} plane, a {112} plane, a {300} plane, a {113} plane, and a {302} plane.

FIG. 6 is an X-ray diffraction diagram of Sample No. 6 according to an example shown in Table 1, and a diffraction peak of metallic chromium is present on a {110} plane, a {200} plane, and a {211} plane, and a diffraction peak of $Cr_2N$ is present on a {110} plane, a {002} plane, a {111} plane, a {112} plane, a {300} plane, and a {113} plane.

FIG. 7 is an X-ray diffraction diagram of Sample No. 12 according to an example shown in Table 1, and a diffraction peak of metallic chromium is present on a {110} plane, a {200} plane, and a {211} plane, and a diffraction peak of $Cr_2N$ is present on a {110} plane, a {002} plane, a {111} plane, a {112} plane, a {300} plane, and a {113} plane.

Table 1 shows evaluation results. Table 1 shows a relative wear amount and a relative cracking/peeling generation load with respect to each value of a nitrogen content (mass %), an IP (%), and a micro-Vickers hardness (HV). The relative wear amount and the relative cracking/peeling generation load are relative values in the case where a wear amount and a cracking/peeling generation load of a coating film are respectively 1 (reference value) when the nitrogen content is 2.0 mass % and the IP is 3% (Sample No. 1 of the example). That is, a smaller relative wear amount indicates that the relative wear amount is excellent, and a larger relative cracking/peeling generation load indicates that the relative cracking/peeling generation load is excellent.

As described in Comparative Examples 1 and 2, when the content of nitrogen and the IP are small, the hardness of a coating film is low, and the coating film is likely to peel along with an increase in wear amount. As described in Comparative Examples 3 and 4, when the content of nitrogen and the IP become larger, the toughness of the coating film decreases although the hardness thereof is high, and cracking and peeling are likely to occur. As described in Examples 1 to 14, when the content of nitrogen in the coating film is 2.0 to 8.5 mass % and the IP is 3 to 40%, it is possible to obtain a coating film having a large cracking/peeling generation load and high toughness while ensuring the wear resistance.

TABLE 1

| | Sample No. | Nitrogen content (mass %) | IP (%) | Micro-Vickers hardness (HV) | Relative wear amount | Relative cracking/peeling generation load |
|---|---|---|---|---|---|---|
| Comparative example | 1 | 1.4 | 1 | 740 | 1.7 | 0.7 |
| | 2 | 1.7 | 1 | 810 | 1.3 | 0.8 |
| Example | 1 | 2 | 3 | 950 | 1 | 1 |
| | 2 | 2.5 | 6 | 990 | 0.9 | 1.3 |
| | 3 | 2.8 | 10 | 1,100 | 0.8 | 1.3 |
| | 4 | 3.3 | 15 | 1,120 | 0.9 | 1.4 |
| | 5 | 3.7 | 14 | 1,280 | 0.9 | 1.4 |
| | 6 | 3.9 | 17 | 1,180 | 1 | 1.5 |
| | 7 | 4.4 | 17 | 1,360 | 0.9 | 1.4 |
| | 8 | 5 | 17 | 1,280 | 0.8 | 1.5 |
| | 9 | 5.4 | 18 | 1,420 | 0.7 | 1.5 |
| | 10 | 6.2 | 24 | 1,500 | 0.7 | 1.4 |
| | 11 | 6.6 | 27 | 1,430 | 0.6 | 1.4 |
| | 12 | 7.8 | 28 | 1,480 | 0.6 | 1.3 |
| | 13 | 8 | 32 | 1,530 | 0.7 | 1.1 |
| | 14 | 8.5 | 40 | 1,600 | 0.6 | 1 |
| Comparative example | 3 | 8.7 | 42 | 1,650 | 0.7 | 0.9 |
| | 4 | 9.1 | 41 | 1,700 | 0.7 | 0.9 |

Table 2 shows a relative wear amount and a relative cracking/peeling generation load with respect to each value of an IP Micro-Vickers and hardness when treatment conditions are varied in the case where the content of nitrogen is 2.0 mass %. Treatment conditions A are the same as those of Table 1. In treatment conditions B and C, a bias voltage is set to be lower and a treatment temperature is set to be higher than those under the treatment conditions A. Under the treatment conditions B and C, the IP becomes less than 3%, and the hardness decreases, the relative cracking/peeling generation load decreases, and the relative wear amount increases along with a decrease in content of $Cr_2N$.

TABLE 2

| | Sample No. | Nitrogen content (mass %) | IP (%) | Micro-Vickers hardness (HV) | Relative wear amount | Relative cracking/peeling generation load | Treatment condition |
|---|---|---|---|---|---|---|---|
| Example | 1 | 2 | 3.0 | 950 | 1 | 1 | A |
| Comparative example | 5 | 2 | 1.6 | 690 | 1.2 | 0.8 | B |
| | 6 | 2 | 2.5 | 820 | 1.2 | 0.8 | C |

Note that, in the present invention, in order to increase a cracking/peeling generation load and decrease a wear amount, at least one of carbon and oxygen may be further dissolved in metallic chromium in addition to nitrogen. In this case, it is preferred that the total content of nitrogen, carbon, and oxygen be more than 2.0 mass % and 5.3 mass % or less. It is more preferred that the nitrogen content be a half or more of the total content of nitrogen, carbon, and oxygen. In the case where carbon is dissolved in a coating film, it is appropriate that hydrocarbon gas such as methane be simultaneously introduced in addition to argon and nitrogen. In the case where oxygen is dissolved in the coating film, it is appropriate that oxygen gas be introduced in addition to argon and nitrogen. In the case where carbon and oxygen are dissolved simultaneously, it is appropriate that carbon dioxide gas be introduced in addition to argon and nitrogen.

The invention claimed is:

1. A high-toughness coating film, comprising a composition containing a mixture of metallic chromium having dissolved nitrogen therein and $Cr_2N$,
    wherein a content of the nitrogen in the high-toughness coating film is 2.0 to 8.5 mass %, and
    wherein IP, which is expressed by total of each diffraction peak intensity of $Cr_2N$/(total of each diffraction peak intensity of metallic chromium+total of each diffraction peak intensity of $Cr_2N$), is 3 to 40% when $2\theta$ is in a range of 30° to 90°, where $\theta$ is an incident angle in X-ray diffraction of the high-toughness coating film.

2. A high-toughness coating film according to claim 1,
    wherein the content of the nitrogen in the high-toughness coating film is 3.0 to 7.0 mass %, and
    wherein the IP is 10 to 30%.

3. A high-toughness coating film according to claim 1, wherein a micro-Vickers hardness of the high-toughness coating film is 950 to 1,600 HV.

4. A high-toughness coating film according to claim 1, wherein a micro-Vickers hardness of the high-toughness coating film is 1,100 to 1,500 HV.

5. A high-toughness coating film according claim 1, wherein the high-toughness coating film has a metallic chromium coating film provided therebelow.

6. A sliding member, which is covered with a high-toughness coating
    wherein the high-toughness coating film, comprising a composition containing a mixture of metallic chromium having dissolved nitrogen therein and $Cr_2N$,
    wherein a content of the nitrogen in the high-toughness coating film is 2.0 to 8.5 mass %, and
    wherein IP, which is expressed by total of each diffraction peak intensity of $Cr_2N$/(total of each diffraction peak intensity of metallic chromium+total of each diffraction peak intensity of $Cr_2N$), is 3 to 40% when $2\theta$ is in a range of 30° to 90°, where $\theta$ is an incident angle in X-ray diffraction of the high-toughness coating film.

7. A sliding member according to claim 6, wherein the sliding member comprises a piston ring.

* * * * *